US006203952B1

(12) United States Patent
O'Brien et al.

(10) Patent No.: US 6,203,952 B1
(45) Date of Patent: Mar. 20, 2001

(54) IMAGED ARTICLE ON POLYMERIC SUBSTRATE

(75) Inventors: Dennis P. O'Brien; Jeffrey M. Florczak, both of Maplewood; Robert L. W. Smithson, Minneapolis, all of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/231,428

(22) Filed: Jan. 14, 1999

(51) Int. Cl.$^7$ ....................................................... G03C 3/00
(52) U.S. Cl. .................................................. 430/17; 430/9
(58) Field of Search ............................................ 430/9, 17

(56) References Cited

U.S. PATENT DOCUMENTS

| | | |
|---|---|---|
| 4,087,281 | 5/1978 | Toda et al. . |
| 4,415,239 | 11/1983 | Humphrey ............................ 350/433 |
| 4,468,453 | 8/1984 | Nakamura et al. ................... 430/269 |
| 5,059,454 | 10/1991 | Todd et al. ............................ 427/259 |
| 5,173,441 | 12/1992 | Yu et al. ............................... 437/173 |
| 5,418,541 | 5/1995 | Schroeder et al. ............ 343/700 MS |
| 5,438,402 | 8/1995 | Gupta ................................... 356/35.5 |
| 5,461,212 | 10/1995 | Seiler et al. ..................... 219/121.68 |
| 5,501,944 | 3/1996 | Hill et al. .............................. 430/321 |
| 5,815,494 | 9/1998 | Yamazaki et al. ...................... 372/25 |
| 5,900,980 | 5/1999 | Yamazaki et al. ................... 359/619 |

FOREIGN PATENT DOCUMENTS

| | | |
|---|---|---|
| 0 493 365 A2 | 7/1992 | (EP) . |
| 0 573 091 | 12/1993 | (EP) . |
| 0 727 321 | 8/1996 | (EP) . |
| 0 743 615 A1 | 11/1996 | (EP) . |
| 0 818 846 A2 | 1/1998 | (EP) . |
| 0 936 506 | 8/1999 | (EP) . |
| 9-275081 | 10/1997 | (JP) . |

OTHER PUBLICATIONS

D. Basting, ed., "Industrial Excimer Lasers", 2$^{nd}$Ed., pp. 50–53 (1991).

E. Matthias et al., "The Influence of Thermal Diffusion on Laser Ablation of Metal Films", *App. Phys.*, A 58, pp. 129–136 (1994).

E. Matthias et al., "In–situ Investigation of Laser Ablation of Thin Films", *Thin Solid Films* 254, pp. 139–146 (1995).

Bolle et al., "Characterization of submicrometer periodic structures produced on polymer surfaces with low–fluence ultraviolet laser radiation", *Journal of Applied Physics*, vol. 73, No. 7, Apr. 1993, pp. 3516–3524.

Nanai et al., "Fractal Based Surface Characterization of Laser Treated Polymer Foils", Chaos, Solitons & Fractals, vol. 5, No. 1, 1995, pp. 9–14.

Lazare et al., "Periodic structuration of polymer surfaces with the excimer laser radiation", Nuclear Instruments and Methods in Physics Research B, vol. 105, 1995, pp. 159–163.

Lee et al., Institute of Electrical Engineers, Stevenage, GB, Inspec. No. AN 5888265, Dec. 1997, Abstract.

*Primary Examiner*—Christopher G. Young
(74) *Attorney, Agent, or Firm*—Douglas B. Little; Dean M. Harts

(57) ABSTRACT

Patterned articles, such as RFID antenna, are made by subablation, a process comprising the steps of:

A. providing a substrate having a coating, such as a metal or metal oxide, and an interface comprising the thin region where the coating and the substrate are closest to each other;

B. exposing at least one part of the total area of the coating to a flux of electromagnetic energy, such as a focused excimer laser beam, sufficient to disrupt the interface but insufficient to ablate the coating; and C. removing the parts of the coating in registry with the portion of the interface area that was disrupted, by means such as ultrasonic agitation.

The process has advantages over photo-resist processes in that there is no residual chemical resist left on the product and no undercutting of the pattern or image. It has advantages over laser ablation processes in that higher throughput is possible at the same energy level and there is no microscopic debris left on the product surface.

8 Claims, 4 Drawing Sheets

IMAGED ARTICLE ON POLYMERIC SUBSTRATE

TECHNICAL FIELD

This invention relates the formation of an image or pattern in an article such as a metal coated substrate. More specifically, it relates to the formation of such an image or pattern using a high energy source such as a laser or flash lamp.

BACKGROUND

Surface layer materials are often imaged or patterned for many utilitarian purposes. The surface layers may include vacuum deposited thin films, solution coatings, and electroless or electroplated films. Patterned conductive surface layers may find use in both passive and active electronic circuits, display components, antennas for radio frequency identification tags (RFID), wireless local area networks (LAN), and proximity detectors as well as antennas for communication such as pagers, cell phones, and satellite reception. Optical surface layers may find application as optical components such as diffractive optical elements and security images, or in telecommunication applications as components that can perform optical switching, modulation, and multiplexing or demultiplexing.

There are techniques for forming patterns in surface layers. Two useful methods are chemical etching and laser ablation. Images or patterns created by chemical etching are formed by selectively dissolving the surface layer with the appropriate chemicals or by energy ablation are formed by explosively detaching and removing a thin surface layer in a selective manner to create an image or pattern. However, each of these methods has limitations.

Chemical etching is a multiple step process that may create hazardous waste. Typically a chemical or photo-resist is applied to selected parts of a surface that is to be patterned or imaged. Then, a chemical is applied on the entire surface and is able to remove the coating (e.g. copper) exposed on the surface but not the coating on the part of surface covered by the chemical or photo-resist. The chemical solution containing the dissolved surface layer material is then washed off of the imaged article. The often hazardous solution is collected and treated in a safe manner at some expense. This method is undesirable due to the multiple process steps and the imaged article can have residual photo-resist residue and undercut sidewalls of the image.

Contemporary methods of utilizing lasers to pattern or micro-machine materials rely on the physical phenomena of ablation. Energy ablation is a simpler process that does not involve hazardous waste disposal. Typically, the surface layer of an article to be imaged is exposed (for example through a mask) with light pulses from a high-energy source, such as a laser or a flash lamp. These pulses of energy are absorbed by parts of the surface layer not covered by the mask, and the energy impacting the layer causes a sudden increase in surface temperature for a short time. The rapid rise in temperature causes the surface layer material to explosively detach or eject from the substrate and create a pattern corresponding to the mask pattern.

DISCLOSURE OF INVENTION

An improved method for imaging or patterning surface layer materials has been created which comprises the steps of:

A. providing a substrate having a coating and an interface comprising the thin region where the coating and the substrate are closest to each other;

B. exposing at least one part of the total area of the coating to a flux of electromagnetic energy sufficient to disrupt the interface but insufficient to ablate the coating; and C. removing the parts of the coating in registry with the portion of the interface area that was disrupted.

The substrate can be any material suitable as a support for a radiation-induced image. This process is particularly advantageous for substrates that are susceptible to heat damage such as some polymeric materials including polyester, polycarbonate, polyvinylchloride, and polyimide. The coating can be any imageable material that absorbs radiation. Typical coatings include metals, metal alloys, and inorganic compounds such as metal oxides and metal nitrides as well as organics. The flux of electromagnetic energy may be from a light source such as a laser or a short pulse width flash lamp.

The energy fluence is below the ablation threshold of the surface coating but sufficient to disturb the interface between the coating the substrate. Ablation threshold is the minimum energy needed to ablate a coating from a substrate and is dependent on the coating, substrate and wavelength of energy used. For purposes of this description, the term disrupt, as applied to the interface, means to affect the interfacial bonding between the substrate and the coating so that this interface is weaker than the bonding in the interface regions that have not been exposed to the energy flux. This weakening of the interfacial bond is sufficient to allow the removal of the coating in regions exposed to the energy flux as described herein without removing coating from the unexposed regions.

Less fluence, i.e., energy density at the coating surface, is required to disturb or disrupt the interface than is required in ablation processes, which implies greater throughput or output for a given source of electromagnetic energy flux. Also, there is essentially no redeposition of coating material onto the work piece, which alleviates any detrimental effects of the imaged substrate associated with debris in the article produced.

A reflective, absorptive or diffractive mask defines the desired pattern. As an example, opaque reflective regions and transparent regions define the reflective mask patterns. When a uniform energy flux is incident upon the mask, the energy is reflected by the reflective regions and transmitted by the transparent regions resulting in the exposure of the desired parts of the coating material (corresponding to the pattern) to the energy flux.

The coating that is over the disturbed part of the interface is removed by a method such as contacting it with an adhesive roll, exposing it to high velocity stream of a benign liquid or gas (eg. air or water jet), or ultrasonic agitation in an aqueous solution. As used in this paragraph, the term benign means characterized by having no damaging effect (eg. by chemical reaction, corrosion, or physical erosion) on the coating or substrate. This step of removal of the coating over the disrupted area is relatively inexpensive.

Imaged articles are also part of this invention. Inventive articles comprising an imaged coating on a substrate are differentiated from articles made by ablation by a substantial absence of heat distortion and debris comprising the coating material. They are also differentiated from articles made by chemical or photo-resist process by a substantial absence of photo-resist and absence of undercut of the image which can occur with the chemical patterning process.

Applications that would benefit from this invention include patterning of inorganic thin films for active and passive electronic circuits, antennas for RFID tags, EMI shielding, patch antenna, and biosensing pattern arrays. Patterned optical surface layers made by this invention could also find use in optical wave guides, electro-optic filters and modulators, holograms, security images, graphics and retroreflective materials. Patterned transparent conductors on both rigid and flexible substrates would find application in liquid crystal display (LCD) computer displays, televisions, touch screens, heated and electrochromic windows.

DETAILED DESCRIPTION

The inventors recognized that the light energy absorbed by the work piece material in ablative processes caused thermal and photochemical decomposition which resulted in gas byproducts rapidly expanding and ejecting material fragments from the exposed region. This requires relatively high fluences for complete material removal and precautions to prevent material fragments from depositing onto the work piece or adjacent optical elements.

The present invention allows fine resolution patterning with minimal generation of debris, no use of hazardous chemicals, and reduced process steps as compared to chemical etching techniques. The inventive method takes advantage of the processing used during ablation but eliminates the problem of debris generation and deposition by reducing the energy densities below the ablation threshold. The surface layer regions exposed to the electromagnetic fluences have reduced adhesion to the substrate, allowing the surface layer or coating to be removed by mechanical methods.

Figure 1:
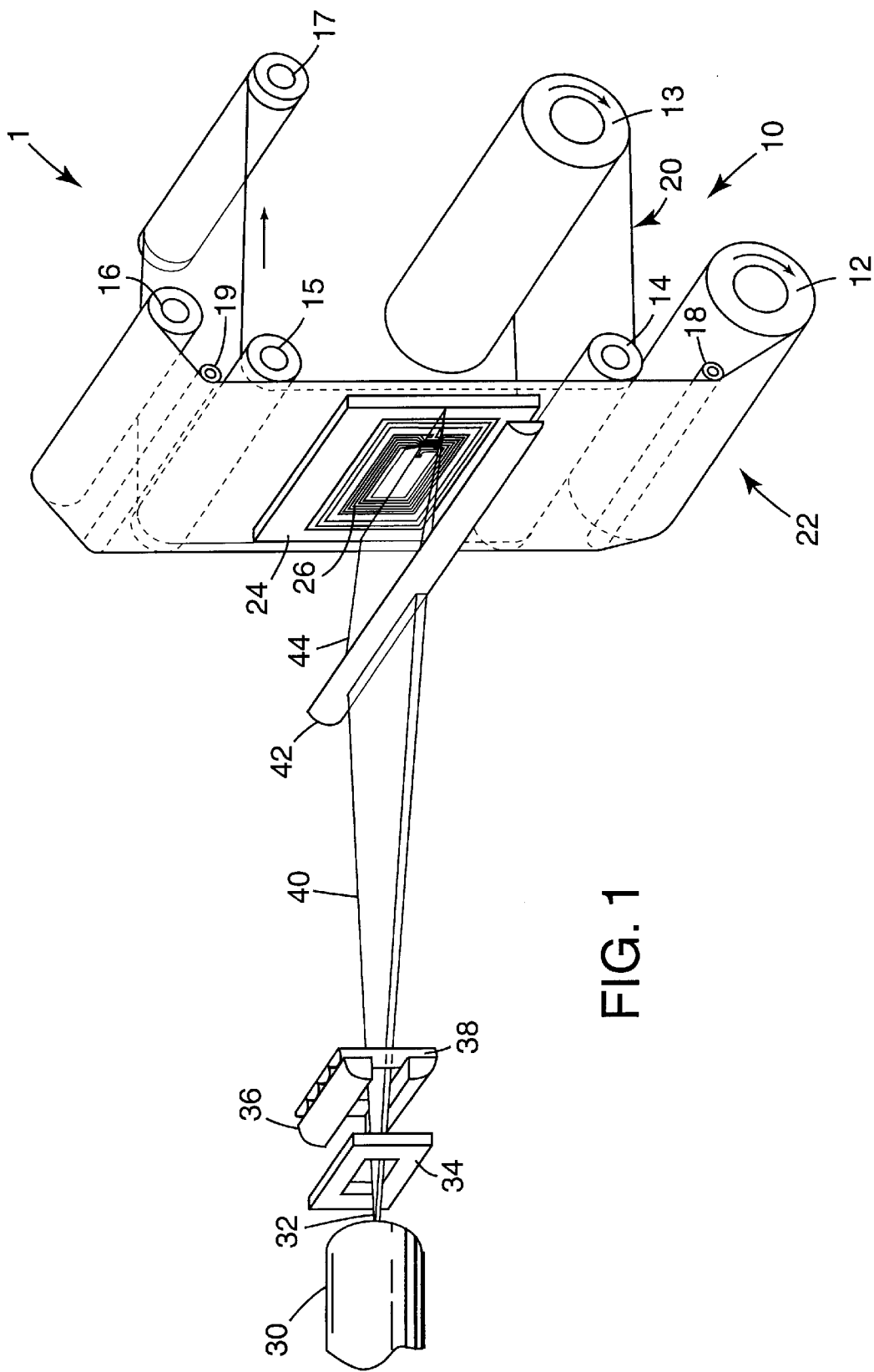
FIG. 1 is a pictorial view of the apparatus used to perform the inventive method.

With reference to FIG. 1, one embodiment of the apparatus 1 which may be used to practice the inventive process includes: energy source 30 which may be a laser; an optic train comprising shutter 34, beam shaper 36, homogenizer 38, and cylindrical converging lens 42; movable translation stage 24 on which is mounted mask 26; and film handling subassembly 10 consisting of protective web unwind and wind-up rollers 12 and 16 respectively, idler rollers 18 and 19, work piece unwind and wind-up rollers 13 and 17 respectively, and idler rollers 14 and 15. In performing the process: the coated substrate to be treated 20 is unwound from roller 13, over idler rollers 14 and 15 and wound onto roller 17 so that it is exposed to the rectangularly shaped laser beam 44; and transparent protective web 22 is unwound from roller 12 past the area where the laser beam 44 is incident and between coated substrate 20 and mask 26 to permit comparison between the process of the invention and a debris-prone ablation process without ruining mask 26. The protective layer is not needed when only the method of the invention is used.

During the exposure of mask 26, protective web 22 and coated substrate 20 to laser beam 44, preferably protective web 22, coated web 20 and mask 26 are moved at the same rate of speed in front of laser beam 44 so that the whole area of the mask is exposed to the laser beam substantially uniformly. This can be accomplished by means within the skill of the art for moving translation stage 24 and advancing both coated substrate 20 and protective web 22. The laser beam thus traverses over the whole area defined by the mask in order to expose the coated substrate behind the mask. After the area to be imaged has been exposed for sufficient time to the laser, the exposure is stopped (for example by shutting shutter 34) and coated substrate 20 and protective web 22 are advanced on their rollers so that a new area is available for processing. Protective web 22 is transparent to the electromagnetic energy of the beam 44.

Coated substrate 20 typically comprises a polymer web substrate coated with a thin layer of material. The substrate can be any material that can support an image. Because the process operates at energy levels below that which may distort some substrates, articles made with such substrates are particularly benefited. Such substrates typically comprise a polymer web. Useful polymers for the substrate are: polyester, polycarbonate, polyethylene, polyamide, polyvinylchloride, polystyrene, polypropylene or polyimide.

Some of these would not normally be in the form of roll goods as shown in FIG. 1. Indeed, the substrates may be in a variety of forms depending on the application. Some useful forms include, for example, flat films or foils in sheet or roll form, rods, fibers beads, wafers, panels, platters, and nonwoven webs. These forms can be prepared from a wide variety of materials. Not all materials can be prepared in all of the forms, but persons skilled in the art of material processing will be able to determine the possibilities for the various material sets.

The substrate may be organic or inorganic. Inorganic substrate materials include silica based glasses, ferrous and nonferrous metals, ceramics, semiconductors such as silicon, germanium, gallium arsenide, gallium nitride, and other metal inorganics such as aluminum oxide and titanium dioxide.

One substrate polymer that has been used in making this invention is PETG polyester from Eastman Chemical Company, Kingsport, Tenn. It is a clear, amorphous copolyester based on poly(ethylene terephthalate) having a density of 1.27 g/cm$^3$ and is useful for making heat laminated cards such as RFID cards. Other polymers which can be heat laminated (eg. polyesters coated with one or more vinyl polymer layers) would also be useful substrates for such applications.

Onto the substrate, an imageable material is coated to the desired thickness for a particular application. This coating may be a single or multiple layers. Depending upon the material composition, a wide variety of techniques can be used to coat. For example, for thin metallic film coatings, vacuum evaporative or sputtering deposition techniques are widely known in the art to produce excellent film properties. For organic film coatings, a number of solution coating methods are well known, such as gravure, slot, and kiss coating. Persons skilled in the art of coating and materials processing will be able to select the appropriate coating techniques for the specific coating materials and substrates. Materials with imageable characteristics include both organic and inorganic materials. By way of example, inorganic materials with useful characteristics include metal films such as copper, silver, gold, nickel, chromium, tin, indium, aluminum; metal alloys such as NiFe, AgZn; oxide films such as indium-tin-oxide, silicon dioxide, silicon monoxide, zinc oxide, aluminum oxide; and other inorganic films such as lithium niobate, magnesium fluoride, zinc sulfide, and calcium fluoride. Organic coatings include acrylate, polycarbonate, and epoxy-based polymers.

The coating may contain organic and inorganic materials to provide optical, electrical, structural or aesthetic features. Coating layers to provide appropriate optical properties may include oxides such as germanium oxide, silicon dioxide, silicon monoxide, lithium niobate, and/or $LiTaO_3$, sulfides such as ZnS, and fluorides such as calcium fluoride and magnesium fluoride. Aesthetic features could be provided by alloys, oxides, and nitrides such as niobium oxide, tantalum oxide, silver-zinc alloys, and titanium nitrides.

There may also be a tie layer in the interface between the coating and the substrate, which alters the adhesion of the coating to the substrate. The tie layer would be of a material different from that of either the coating or the substrate, and it is an important advantage of the inventive process that such a tie layer can be removed at the same time as the coating layer. In conventional wet etching processes, a separate process step with different chemicals can be required to remove a tie layer.

The energy source is one that is able to generate a sufficient range of fluence to the coating surface to result in adequate disruption of the coating-substrate interface. Suitable energy sources include lasers and flashlamps. The operating wavelengths of lasers can go from the ultraviolet (UV) to the infrared. Two classes of lasers are described that are particularly useful for this process.

Excimer lasers are high power lasers that can generate high fluence light in the ultra-violet frequency range. Their lasing capability is based upon the excitation of specific diatomic gas molecules. In particular, excimer lasers constitute a family of lasers, which emit light in the wavelength range of 157–355 nm. The most common excimer wavelengths and respective diatomic gases are XeCl (308 nm), KrF (248 nm) and ArF (193 nm). The lasing action within an excimer is the result of a population inversion in the excited dimers formed by the diatomic gases. Pulse widths are typically in the 10s to 100s of nanoseconds resulting in high energy, short pulse width pulses. These characteristics of the excimer laser can lead to subablative or ablative processing conditions for materials with significant absorption within the excimer excitation range depending on the energy output chosen.

Solid state lasers are high power lasers that can generate concentrated light beams from the infrared to the ultra-violet wavelength range. A selected portion of these solid state lasers is based on materials and involves the doping of neodenium into a solid host such as yittrium-aluminum-garnet (YAG), yittrium-lithium-fluoride (YLF), and yittrium vanadate ($YVO_5$). These particular materials lase at a fundamental wavelength in the infrared wavelength range of 1.04 to 1.08 $\mu$m. This lasing can be extended to shorter wavelengths through the use of nonlinear optical crystals such as lithium triborate (LBO) or potassium titanyl phosphate (KTP). As an example, the fundamental 1.06 $\mu$m radiation from a neodinium doped YAG laser can be frequency doubled to a wavelength of 532 nm or frequency tripled to 355 nm using these nonlinear crystals. Like the excimers, the characteristics of the solid state laser can lead to subablative (ie. at energy levels below the ablation threshold) or ablative processing conditions for materials with absorption in the useable wavelength ranges.

An alternative light source to the excimer laser is a short pulse linear excimer, ultraviolet flash lamp. Typically, such a lamp would include a transparent quartz lamp tube with a wall thickness of about 1 mm having an internal bore of about 3 to 20 mm in diameter. Such flash lamps can be as long as 30 cm. Electrodes preferably made of tungsten are sealed into the ends of the lamp tube which is filled with a noble gas such as xenon. The flash lamp is pulsed in the range of 1 to 20 Hz by applying a high voltage in the range of 5 to 40 KV to the electrodes using a capacitor bank. The charge ionizes the xenon atoms to form a plasma which emits a broadband of radiation ranging in wavelength from about 200 nm to about 800 nm. The flash lamp can include a reflector placed partially around the tube to shape and guide the radiation from the lamp toward the mask and workpiece.

Linear flash lamps are capable of producing high intensity, high fluence energy output at shorter wavelengths in relatively short pulses of about 5 $\mu$sec. For example, it has been found that a xenon linear flash lamp, with a broadband spectral output can provide a useful energy density of between about 1.0 and 1.5 $J/cm^2$ during a pulse of about 2 and 6 $\mu$sec.

Each coating and substrate system has fluence levels defined as the ablation threshold and the subablation threshold. The ablation threshold fluence is the minimum energy per unit area that must be absorbed by the coating to cause the coating to explosively decompose or ablate from the substrate. The subablation threshold fluence is the minimum energy per unit area required at the coating surface to heat the coating sufficiently to disrupt the interface between the coating and the substrate but not ablate it. Subablation occurs just below the ablation threshold fluence and extending down to the subablation threshold fluence.

Adhesion of the coating to the substrate is also important. The adhesion must be sufficient so that the coating in registry with the undisrupted interfacial regions is not removed by the step that removes the coating in registry with the disrupted interfacial regions. Since disruption of the interface generally reduces the adhesion between the coating and the substrate, satisfactory images result when the adhesive force between the unexposed coating and the substrate is within the range of about 40 to 700 g/cm as measured by Method B described hereinafter.

The laser 30 shown in FIG. 1 and used in some of the experiments which led to this invention was an excimer laser from which emanates laser beam 32 having approximately a rectangular cross section with an aspect ratio of about 3:1. The excimer laser produces a short pulse (eg. 20 nanoseconds) beam with sufficient fluence (measured in milli-Joules/$cm^2$) to disrupt the interface. The high density energy of the excimer laser is available over a relatively large area, as compared to other lasers.

The beam shaper 36 functions principally to reshape the top and bottom edges of the laser beam in order to increase usable pulse energy. The beam 32 exits the laser with a gaussian energy profile with a reduction of energy density away from the beam axis. The beam shaper changes the energy profile to be more rectangular, sometimes referred to as a top hat profile. Beam shapers are commercially available, one embodiment being available from Optec, in Site du Grand Hornu, Belgium. The beam shaper preferably has a focal length of at least 20 mm. In one embodiment of a beam shaper, the active lenses are plano-convex lenses with a focal length of 240 mm. The width element (at 50 mm) was sufficient to span the entire width of a raw laser beam 33 mm wide. The height element of the lenses (at 12.5 mm) was equal to at least half of the beam height (11 mm).

The beam shaper elements act upon the top and bottom edges of the raw excimer beam to redirect them vertically toward the beam center.

The homogenizer 38 functions to divide and overlap a sufficient number of segments of beam 32 to make the resulting beam 40 homogeneous in the horizontal direction (across the beam from one side to the other). Point-to-point fluctuations in energy distribution can be reduced by mixing various parts of the excimer laser beam with each other using, for example an array of lenslets oriented vertically through which the beam passes. Homogenization can increase the useful portion of the excimer beam 40. A number of homogenizers are known in the art, as taught in *Industrial Excimer Lasers,* 2nd ed., Basting, D., ed., Lambda Physik GmbH, Gottingen, Germany. One useful homogenizer contained a lenslet array of seven cylindrical, plano-convex lenses with a focal length of 16 mm. The width of each element was 5 mm, and the length (38 mm) was sufficient to span the height of the beam (11 mm). The lenslets were side-by-side to cover the entire width of the raw beam and homogenize it in the horizontal direction.

Laser beam 40 expands in cross section over the distance between laser 30 and cylindrical lens 42, but cylindrical lens 42 concentrates the intensity of the entire beam 40. The beam exiting lens 42 has substantially less height (for example about 10 times less) than the beam 40 which entered lens 42. One useful embodiment was a plano-convex lens with a focal length of 103 mm. Its width was 38 mm, and its length was 350 mm making it sufficiently large to accept an entire reshaped and homogenized beam. The cylindrical lens 42 is made of a highly transmissive material such as fused silica. Thus, the beam shaper 36 and cylindrical lens 42 affect the vertical profile of the laser beam, and the homogenizer 38 effects homogenization orthogonal to the vertical.

Preferably, mask 26 is made of a base material that is highly transparent to the excimer laser beam. The base material can for example be coated with a protective overlay that is reflective to the wavelengths of electromagnetic energy used. For example, the base material of the mask can be synthetic fused silica, and the protective overlay can be aluminum. The aluminum can be vacuum deposited onto the fused silica base material to a depth of approximately 600 nm. The pattern of the mask is formed in the protective overlay by standard semiconductor industry photolithographic and wet etch processing techniques.

The parts of the optic train 30, 34, 36, 38, 42 and mask 26 can be aligned properly using a camera and taking accurate measurements of distance and height. The initial height of mask 26 can be adjusted by means of translation stage 24 a device known to those skilled in the art. The distance between the cylindrical lens 42 and the front of the coated substrate 20 is one parameter that determines the width of the incident laser beam and the fluence or energy density. The distance between mask 26 and coated substrate 20 is referred to as the path. The path is preferably no greater than 2 mm long, more preferably about 50 to 100 micrometers long.

Figure 3:
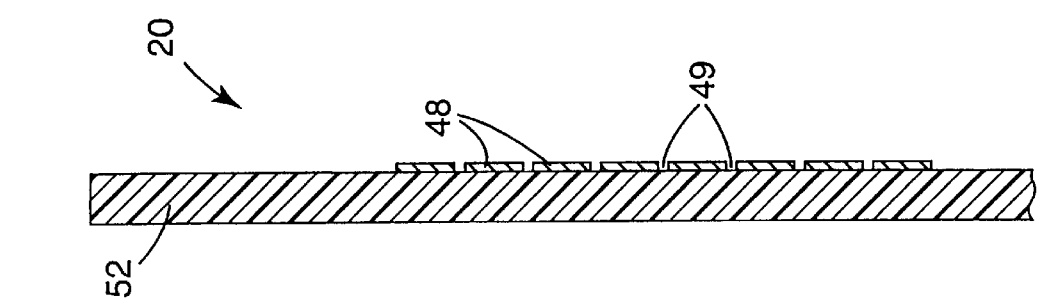
FIG. 3 is a cross sectional view of the antenna of FIG. 2.
Figure 2:
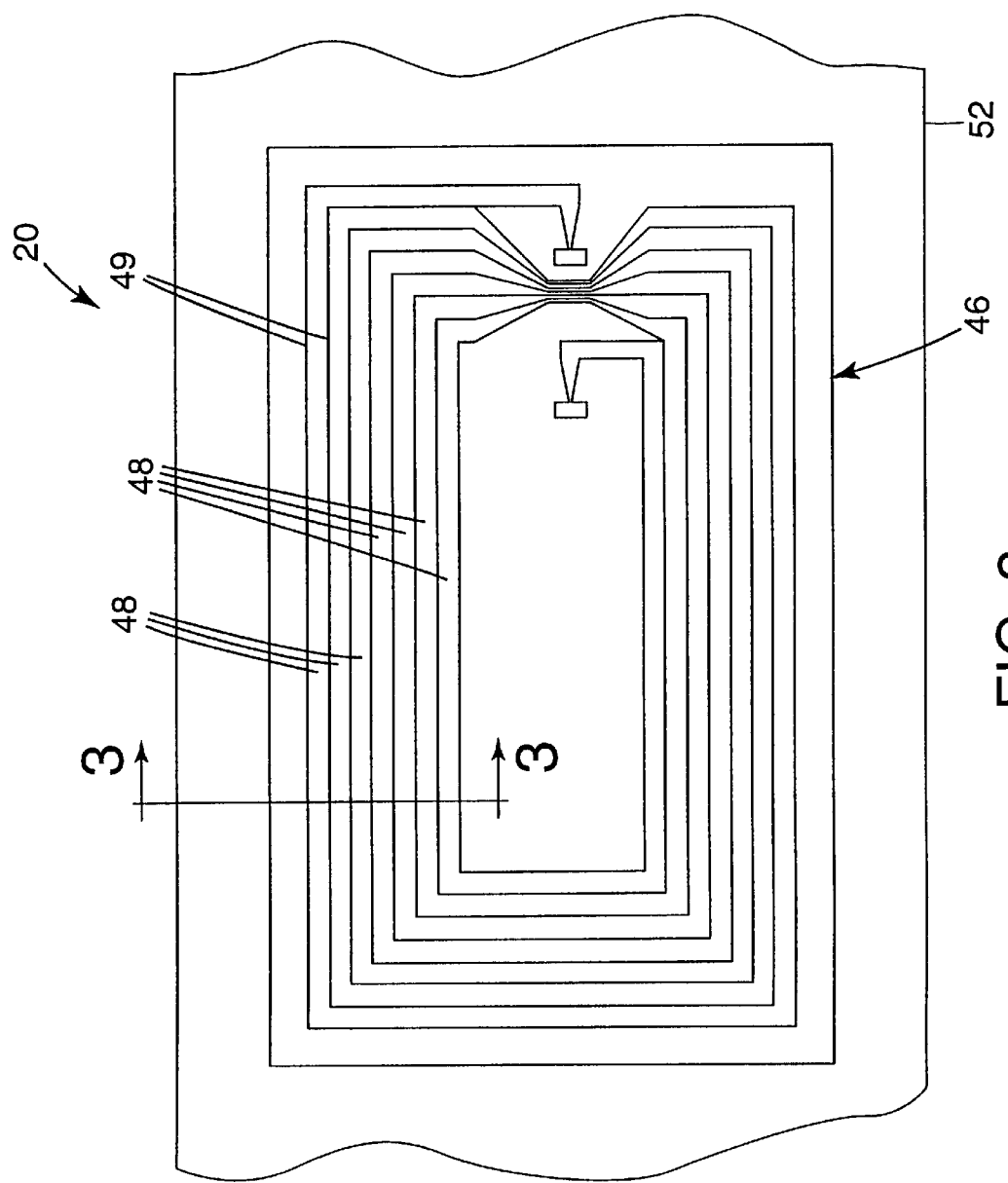
FIG. 2 is a plan view of an antenna made by the inventive process.

FIG. 2 depicts an example of a product which can be made by the inventive process and which itself is inventive. It is a patterned copper coating 46 on a polymeric substrate 52 which can serve as an RFID antenna. RFID is widely used to identify things or people and in electronic article surveillance. The series of generally rectangular, stripe-like regions 48 are the parts of the coating (eg. copper) which were unexposed to the electromagnetic energy flux and remained adhered to substrate 52. The lines 49 separating regions 48, the area in the middle of the pattern, and the region outside of the pattern of stripe-like rings in a generally rectangular array correspond to parts of the coated substrate not protected by the mask and from which the coating was removed in the process. In the cross-sectional view of FIG. 3, one can see that the stripe-like regions 48 are raised above the surface of the substrate 52 from which the remainder of the coating has been removed.

Figure 4:
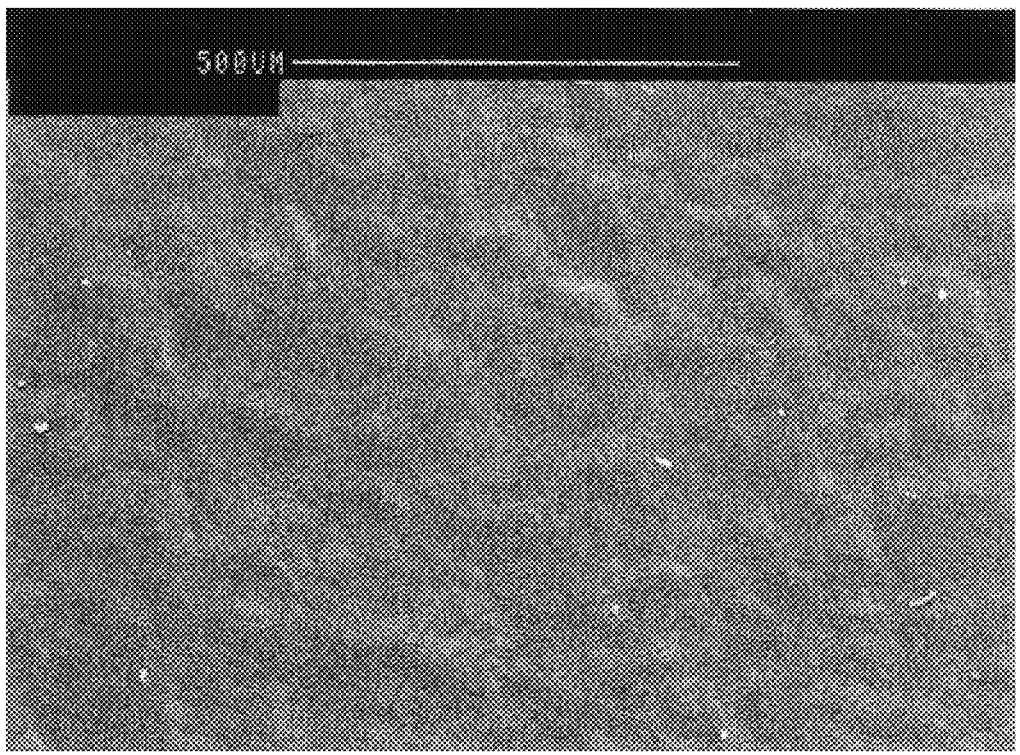
FIG. 4 is a back-scatter scanning electron photomicrograph of an RFID antenna made by the inventive process at 102×magnification.
Figure 5:
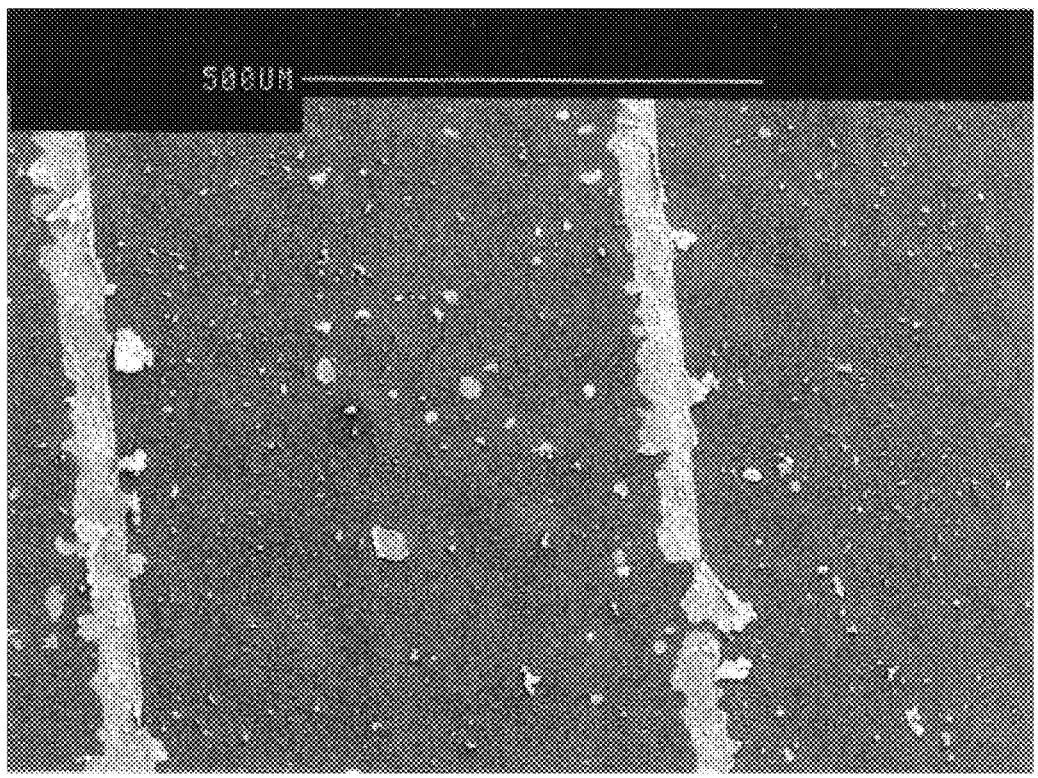
FIG. 5 is a back-scatter scanning electron photomicrograph of an RFID antenna made by laser ablation at 102× magnification.

FIGS. 4 and 5 demonstrate the cleanliness advantage of the inventive articles. FIG. 4 shows basically no debris in the field of view which is an area of an inventive patterned substrate from which metal had been removed after treatment in accordance with the process of this invention. On the other hand, FIG. 5 shows metal debris and stripes left in an exposed area of the same type of metal coated substrate which had been patterned by laser ablation.

The invention will be further clarified by the following examples which are exemplary and not intended to limit the scope of this invention. In the experimental work, the following test methods were used.

A spectrophotometer was used to determine the optical wavelength and energy source appropriate for disruption of an interface. The coated surface layer of the coated substrate was placed under a spectrophotometer, Model Lambda 900 available from Perkin-Elmer Norwalk, Conn., and the absorption of the surface coating was measured as a function of wavelength. Generally, a wavelength between 200 nm and 2 $\mu$m would be selected at which the coating had the most absorption. An energy source was then chosen based in part on whether wavelengths in the operating range of wavelengths for the source were sufficiently absorbed by the coating. A rough measure of sufficiency would be that absorption was sufficient to ablate the coating.

Adhesion between the coating layer and the substrate layer was evaluated by two methods and will be called the interlayer adhesion. The methods were used to determine whether the interlayer adhesion is sufficient to permit selective removal of the coating over the disrupted interface while not removing the coating over the interface that was not disrupted. Method A was a qualitative test and Method B was a quantitative test.

In Method A, two different pressure-sensitive adhesive (PSA) tapes, each approximately 15 cm by 12 mm, were applied to the surface of the coating on the coated substrate. Tape 1 was a PSA tape having relatively weak adhesion, acrylate-based Scotch Brand No. 810 Magic Tape and Tape 2 was a PSA tape having relatively strong adhesion, Kraton™ block copolymer based Scotch Brand No. 396 Box Sealing Tape. A 5 cm wide roll weighing 1.5 kg was passed once over each tape such that each tape had one end that was not adhered to the coating surface. The tapes were allowed to rest for about one minute. The free end of each tape was then gripped by hand and the tape was peeled back from the surface at approximately 180 degrees and at a speed of approximately 2 cm per second. If the coating was removed by Tape 1, the interlayer adhesion was likely to be insufficient. The coating over even the interface that was not disrupted was likely to be removed together with that over the disrupted interface. If the coating was not removed by Tape 2, the interfacial adhesion was likely to be too great to permit the coating over the disrupted interface to be removed by subsequent removal techniques of the invention.

In Method B, the force required to remove the coating from the substrate was measured. Metallic coatings on a substrate may require specially made test samples having a greater thickness than used for an application to prevent premature tearing of the coating during testing. Test strips having surface strips of coating material (eg. copper) that were 5 mm wide were prepared. One end of the coating surface strip was manually separated from the substrate by means of a thin blade (eg. a scalpel). The sample was then adhesively affixed to a staging system that allowed horizontal movement in response to a vertical peel of the coating at 90 degrees from the substrate. Peel was performed smoothly with a force measuring device (Instron™ Model 1122 available from Instron Corp., Canton, Mass.) operated at a speed of approximately 0.17 cm per second. If the adhesive force between the coating and substrate was between about 40 and 700 g/cm, suitable patterning could be accomplished with this invention.

EXAMPLES 1–3

Comparative Examples 1–2

A metal-coated substrate was exposed to sufficient radiation of an energy source to disrupt the interface between the metal and the substrate. The metal-coated substrate consisted of an organic polymer substrate (PETG, containing $TiO_2$ filler and having a thickness of 125 micrometers ($\mu$m) and available from VPI, Chebogan Falls, Wis.) coated with a metal (copper, evaporation-coated with an electron beam in a vacuum to a thickness of 250 nm) and had an ablation threshold of 325 mJ/cm$^2$ and a subablation threshold fluence of 190 mJ/cm$^2$.

A laser light beam was formed by an ultraviolet energy source (Model LPX 315 150 watt Excimer Laser available from Lambda Physik of Germany) utilizing krypton fluoride (KrF) gas to produce ultraviolet radiation at 248 nm. The source was operated to form a beam with a repetition rate of 75 Hz, a pulse width of 10 ns and an energy output of 750 mJ per pulse. The beam was passed through an optic train composed of a beam shaper (Model HY-120 Excimer Laser Beam Shaper, manufactured by Optec S. A., Hornu, Belgium) followed by an homogenizer and then a single piano-convex lens. The homogenizer was an array of plano-convex cylindrical lenses each with a focal length of 16 mm. The single lens was a piano-convex cylindrical lens with a focal length of 103 mm. The laser beam was expanded horizontally to about 20 cm prior to entering the single plano-convex cylindrical lens. The distance between the metal surface of the metal-coated substrate and the surfaces of the beam shaper, homogenizer and cylindrical lens that was closest to the metal surface was 670 mm, 620 mm and 93 mm, respectively. The resulting shaped beam was incident on the copper coating surface with a beam cross section 200 mm in length and 0.76 mm in width.

This very long and narrow beam passed from the optic train through a patterning mask (made of an EQZ grade fused silica plate available from Hoya, Corp., Shelton, Conn.) that was vacuum-coated with aluminum in a thickness of approximately 600 nm and imaged by selectively removing aluminum with standard photolithographic and wet etching techniques). The beam then passed through a protective web (OPP grade 7 $\mu$m thick polypropylene available from Bolmet Inc., Dayville, Conn.) that was adjusted to be in contact with the metal surface and spaced 25 $\mu$m from the patterning mask. The beam energy density or fluence was 220 mj/cm$^2$ at the copper surface (as measured by an apertured Joulemeter, model ED-500 from Gentec Inc., Quebec, Canada) sufficient to disrupt the interface between the metal and the substrate.

The relative positions of the patterning mask and the metal-coated substrate with respect to the shaped beam were controlled by a linear translation stage (Model OFL-1515 available from NEAT Technologies, Lawrence, Mass.). The translation stage was moved at a linear rate of 5.9 cm/sec. The final beam profile was overlapped by 12% for successive pulses. Both the protective web and Cu/PETG substrate were moved parallel to the direction of the mask travel and at 5.9 cm/sec to form a resulting exposed rectangular area of about 8.7 cm×5.5 cm. Within the rectangular area, the pattern of the mask could be visually seen by comparing the exposed and unexposed portions of the sample. The metal surface that had been exposed through the mask appeared dark in comparison to the unexposed metal surface that had been covered by the mask, but none of the copper was removed by the excimer radiation.

Samples of exposed metal-coated substrate were then placed in a water bath at a temperature of 20° C. with two immersible ultrasonic transducers (Model LP 610-6 Immersible Ultrasonic Transducers excited by a Model EMLX 30-12 generator both available from Branson Cleaning Equipment Co., Shelton, Conn.). The metal surfaces of the samples were placed about 18 mm from the transducers for about 4 seconds with the oscillation amplitude of the transducers limited to 18 $\mu$m (0.7 mils) peak-to-peak to remove the metal at the disturbed regions of the copper/PETG interface. This ultrasonic treatment resulted in the complete removal of the exposed copper but not the unexposed copper. The pattern in the copper coating had good resolution. The fine features were as small as 75 $\mu$m wide metal lines and 75 $\mu$m wide spaces. Also, there were no electrical shorts between the lines or voids within the lines.

Examples 2 and 3 were made and tested as in Example 1 except the fluence was approximately 200 and 300 mJ/cm$^2$, respectively. The pattern in the copper coating had good resolution. The fine features were as small as 75 $\mu$m wide metal lines and 75 $\mu$m wide spaces. Also, there were no electrical shorts between the lines or breaks within the lines.

For comparison, Comparative Examples 1 and 2 were made like Example 1 except for the output energy of the laser. Comparative Example 1 was exposed to a fluence of 150 mJ/cm$^2$, and Comparative Example 2 was exposed to a fluence of 400 mJ/cm$^2$ respectively. The exposed metal in Comparative Example 1 was not removed because the fluence used was insufficient to disrupt the interface. In Comparative Example 2, electrical shorts were observed in the patterned copper because the fluence was sufficient to ablate the metal and some of the ablated molten metal re-deposited onto the metal coated surface of the sample.

EXAMPLE 4

This example illustrated the effect of a different energy source on image characteristics.

Example 4 was made in a manner similar to Example 1 except a different energy source and optical train were used, some of the conditions were changed, and a different cleaning method was used. The energy source was an infrared laser (Model 2660 Nd:YAG Infrared Laser available from Excel Technology Inc., Hauppauge, N.Y.) operating at a wavelength of 1.06 $\mu$m, a repetition rate of 2000 Hz, an energy per pulse of 0.6 mJ, and a pulse width of 200 ns. The laser light incident on the metal coating was a dot or point, in contrast to the line or narrow rectangle of light in example 1 (as shown in FIG. 1). The optical train consisted of only a round piano-convex lens with focal length of 10 cm. There was no beam shaper, homogenizer, or cylindrical lens. No mask and no protective web were used. The resulting fluence reaching the metal surface was determined from the energy output of the laser as measured by a joulemeter (Model J3-09 available from Molectron, Inc. Portland, Oreg.) and the area irradiated on the surface of the metal and was calculated to be 350 mJ/cm², below that needed to ablate the metal from the substrate for this wavelength. The translation stage was moved at a speed of 20 cm/s to result in a 20% overlap between successive pulses on the metal surface. Parallel line patterns were exposed with spacing between lines achieved by cross-web movement of the second axis of the translation stage after each pass of the laser.

The copper was not removed from the PETG surface by the YAG infrared laser exposure, but the areas exposed to the infrared radiation could be detected by the difference in reflectivity from the unexposed regions. The exposed areas of the metal layer were removed with the following technique. A pressure-sensitive adhesive coated roll was moved over the metal coating side of the metal coated substrate with one pass. The roll was 20 cm wide and weighed about 4.5 kg. Visual inspection of the 50 μm wide lines and spaces on the metal-coated film showed that the metal was completely removed over exposed regions where the interface was disrupted and completely intact over regions where the interface was not disrupted.

EXAMPLE 5

This example illustrated the use of a metal oxide coating on the substrate.

Example 3 was made as in Example 1 except that a metal oxide coated substrate was used and the energy output was reduced to about 650 mJ. The metal oxide coated substrate consisted of polyester that had been sputter coated with indium tin oxide to achieve a conductivity of 80 Ohms/square and available as No. OFC80 from Courtaulds Performance Films Inc., Canoga Park, Calif. The optical train was configured to shape the incident excimer laser beam into a 150 mm by 0.89 mm rectangle at the metal oxide surface. The energy from the excimer laser was adjusted to achieve a calculated fluence of about 80 mJ/cm² in this rectangle, below the ablation threshold of 90 mJ/cm² that is needed to ablate this coating from this substrate for this wavelength. The final beam profile was overlapped by 10% for the successive pulses. The subsequent pattern had good resolution with fine features as small as 50 μm wide lines and spaces.

EXAMPLE 6

This example illustrated the use of a different substrate class.

Example 6 was made as in Example 1 except that a different substrate was used and the fluence was reduced. (energy level was about 650 mJ). The metal coated substrate consisted of polyimide (50 μm thick film available as Kapton™ E from DuPont Inc., Circleville, Ohio) that had been sputter coated with copper to achieve a coating thickness of approximately 250 nm. The resulting subablation fluence used to disrupt the coating substrate interface was calculated to be 170 mJ/cm², below the ablation threshold of approximately 300 mJ/cm² that is needed to ablate the metal from the substrate for this wavelength. The subsequent pattern had good resolution with fine features as small as 75 μm wide lines and spaces.

EXAMPLE 7

This example illustrated the use of an organic coating. Example 7 was made in a manner similar to example I except the material and laser conditions were different. A clear acrylate coating (available from Spray On, division of Sherwin Williams Co., Bedford Heights, Ohio, product number #02000) was sprayed onto a poly(ethylene terephthalate) (PET) substrate to a coating thickness of 3 μm. The coating was allowed to cure at ambient conditions for one hour. This coating/substrate system had an ablation threshold of 100 mJ/cm². The laser energy was adjusted to obtain an energy output of 450 mJ per pulse and yield an energy fluence of 65 mJ/cm² sufficient to disrupt the interface between the acrylate and PET substrate. The acrylate coating was not removed from the PET surface by the excimer laser exposure, but the areas exposed to the radiation could be detected by a difference in reflectivity from the unexposed regions. Ultrasonic treatment resulted in the complete removal of the exposed acrylate but not the unexposed acrylate. The pattern in the arcylate coating had good resolution. The fine features were as small as 75 μm wide lines and 75 μm wide spaces.

While certain representative embodiments and details have been discussed above for the purpose of illustrating the invention, it will be apparent to those skilled in the art that various changes and modifications may be made in this invention without departing from its true spirit or scope which is indicated by the following claims.

What is claimed is:

1. An imaged article comprising a polymeric substrate bearing a patterned image wherein the material of which the patterned image is made comprises an inorganic coating and the patterned image is characterized by a substantial absence of:

A. heat distortion;
   B. debris comprising the material of which the image is made or decomposition products of such material;
   C. photo-resist; and
   D. undercut of the image.

2. The imaged article of claim 1 in which the polymeric substrate comprises a polyester.

3. The imaged article of claim 1 of which the patterned image is an antenna.

4. The imaged article of claim 1 in which the inorganic coating is selected from the group consisting of metal films, metal alloy films, oxide films, lithium niobate films, magnesium fluoride films, zinc sulfide films, LiTaO₃ films, calcium fluoride films, and titanium nitride films.

5. The imaged article of claim 4 in which: the metal is selected from the group consisting of copper, silver, gold, nickel, chromium, tin, indium, and aluminum; the oxide is selected from the group consisting of indium-tin-oxide, silicon oxide, silicon monoxide, zinc oxide, germanium oxide, niobium oxide, tantalum oxide, and aluminum oxide; and the metal alloy is selected from nickel iron and silver zinc alloys.

6. An imaged article comprising a polymeric substrate bearing a patterned image wherein the material of which the patterned image is made consists essentially of an organic film coating and the patterned image is characterized by a substantial absence of:

A. heat distortion;

B. debris comprising the material of which the image is made or decomposition products of such material;

C. photo-resist; and

E. undercut of the image.

7. The imaged article of claim 6 on which the organic film coating comprises an acrylate coating.

8. An imaged article comprising a substrate consisting essentially of a polymeric material, the polymeric substrate bearing a patterned image wherein the material of which the patterned image is made comprises an inorganic coating and the patterned image is characterized by a substantial absence of:

A. heat distortion;

B. debris comprising the material from which the image is made or decomposition products of such material;

C. photo-resist; and

D. undercut of the image.

\* \* \* \* \*

UNITED STATES PATENT AND TRADEMARK OFFICE
CERTIFICATE OF CORRECTION

PATENT NO. : 6,203,952 B1
DATED : March 20, 2001
INVENTOR(S) : Dennis P. O'Brien, Jeffrey M. Florczak, and Robert L.W. Smithson It is certified that error appears in the above-identified patent and that said Letters Patent is hereby corrected as shown below:

Column 7,
Line 14, "$_2$nd ed." should read -- $2^{nd}$ ed. --

Column 9,
Line 39, "piano-convex" should read -- plano-convex --
Line 41, "piano-convex" should read -- plano-convex --
Line 62, "200 mj/cm$^2$" should read -- 220 mJ/cm$^2$ --

Column 10,
Line 64, "piano-convex" should read -- plano-convex --

Signed and Sealed this

Thirteenth Day of November, 2001

Attest:

NICHOLAS P. GODICI
Attesting Officer   Acting Director of the United States Patent and Trademark Office